United States Patent
Lee et al.

(10) Patent No.: US 7,985,651 B2
(45) Date of Patent: Jul. 26, 2011

(54) METHOD OF FABRICATING SEMICONDUCTOR DEVICE HAVING DIFFERENTIAL GATE DIELECTRIC LAYER AND RELATED DEVICE

(75) Inventors: Joo-Young Lee, Hwaseong-si (KR); Jin-Woo Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 143 days.

(21) Appl. No.: 12/318,384

(22) Filed: Dec. 29, 2008

(65) Prior Publication Data
US 2009/0176342 A1 Jul. 9, 2009

(30) Foreign Application Priority Data

Jan. 3, 2008 (KR) .................. 10-2008-0000827

(51) Int. Cl.
*H01L 21/336* (2006.01)
(52) U.S. Cl. .................. 438/270; 257/E21.41
(58) Field of Classification Search .................. 438/270; 257/E21.41
See application file for complete search history.

(56) References Cited

U.S. PATENT DOCUMENTS

| 6,943,075 B2 * | 9/2005 | Joo | 438/211 |
| 7,723,184 B2 * | 5/2010 | Hasunuma | 438/259 |
| 2005/0001257 A1 * | 1/2005 | Schloesser et al. | 257/302 |

FOREIGN PATENT DOCUMENTS

| KR | 10-2005-0034292 | 4/2005 |
| KR | 10-2005-0086132 | 8/2005 |
| KR | 10-0681286 | 2/2007 |

OTHER PUBLICATIONS

A. Bouhdada et al. "New model of gate-induced drain current density in an NMOS transistor", Microelectronics Journal 29, 1998, pp. 813-816.

* cited by examiner

*Primary Examiner* — Matthew C Landau
*Assistant Examiner* — Sonya D McCall Shepard
(74) *Attorney, Agent, or Firm* — Harness, Dickey & Pierce, P.L.C.

(57) ABSTRACT

A semiconductor device and method of fabricating a semiconductor device are provided. The method includes forming a gate trench in a semiconductor substrate to define source/drain regions. The source/drain regions are separated from each other by the gate trench, and the semiconductor substrate is exposed through the gate trench. The semiconductor substrate has impurities of a first conductivity type. The source/drain regions have impurities of a second conductivity type different from the first conductivity type. The concentration of the second conductivity type impurities increases as the impurities approach the surfaces of the source/drain regions. A differential gate dielectric layer is formed along the surfaces of the source/drain regions and the semiconductor substrate exposed through the gate trench. A gate electrode filling the gate trench is formed. The differential gate dielectric layer has a first thickness between the gate electrode and the semiconductor substrate and has a second thickness greater than the first thickness between the gate electrode and the source/drain regions.

15 Claims, 8 Drawing Sheets

METHOD OF FABRICATING SEMICONDUCTOR DEVICE HAVING DIFFERENTIAL GATE DIELECTRIC LAYER AND RELATED DEVICE

PRIORITY STATEMENT

This application claims priority under 35 U.S.C. §119 to Korean Patent Application No. 10-2008-0000827, filed Jan. 3, 2008, in the Korean Intellectual Property Office (KIPO), the entire contents of which are incorporated herein by reference.

BACKGROUND

1. Field

Example embodiments relate to a semiconductor device and method of fabricating a semiconductor device and, more particularly, to a method of fabricating a semiconductor device having a differential gate dielectric layer and a related semiconductor device.

2. Description of Related Art

Prompted by the high integration of today's semiconductor devices, research into integrating a large number of devices within a restricted space is being conducted. A conventional planar transistor includes a gate electrode disposed on a semiconductor substrate, and source and drain regions disposed in the semiconductor substrate contacting both sides of the gate electrode. Reducing the size of the gate electrode reduces the distance between the source and drain regions, and thus, reduces an effective channel length. Such a reduction in the effective channel length may cause a short channel effect, which deteriorates active switching characteristics of a device. Also, the reduced size of the gate electrode and source and drain regions may degrade current drivability. Thus, there is a limit in increasing the integration of planar transistors. In order to overcome the above problems, research into a recessed channel transistor and method of fabricating the same is underway.

SUMMARY

The present invention relates to a semiconductor device and/or method of fabricating a semiconductor device.

According to one example embodiment, a method of fabricating a semiconductor device includes forming a gate trench in a semiconductor substrate to define source/drain regions. The source/drain regions are separated from each other by the gate trench formed in the semiconductor substrate. The semiconductor substrate is exposed through the gate trench. The semiconductor substrate has impurities of a first conductivity type. The source/drain regions have impurities of a second conductivity type different from the first conductivity type. The concentration of the second conductivity type impurities increases as the impurities approach the surfaces of the source/drain regions. A differential gate dielectric layer is formed along the surfaces of the source/drain regions and the semiconductor substrate exposed through the gate trench. A gate electrode filling the gate trench is formed. The differential gate dielectric layer has a first thickness between the gate electrode and the semiconductor substrate and has a second thickness greater than the first thickness between the gate electrode and the source/drain regions.

A first impurity region may be formed by implanting Arsenic (As) into the semiconductor substrate. A second impurity region may be formed by implanting Phosphorous (P) into a lower part of the first impurity region. The first impurity region and the second impurity region may constitute the source/drain regions. The first impurity region may be formed at a first ion implantation energy of about 5 KeV to about 20 KeV and a first dose of about $1\times10^{13}$ atoms/cm$^2$ to about $5\times10^{15}$ atoms/cm$^2$. The second impurity region may be performed at a second ion implantation energy of about 10 KeV to about 20 KeV and a second dose of about $1\times10^{13}$ atoms/cm$^2$ to about $5\times10^{13}$ atoms/cm$^2$. The first ion implantation energy may be lower than the second ion implantation energy and the first dose may be greater than the second dose.

A third impurity region may be formed by implanting the first conductivity type impurities into a lower part of the second impurity region. A fourth impurity region may be formed by implanting the first conductivity type impurities into a lower part of the third impurity region. Forming the third impurity region may include implanting Boron (B) at a third ion implantation energy of about 30 KeV to about 40 KeV and a third dose of about $1\times10^{12}$ atoms/cm$^2$ to about $4\times10^{12}$ atoms/cm$^2$. Forming the fourth impurity region may include implanting Boron at a fourth ion implantation energy of about 40 KeV to about 60 KeV, and a fourth dose of about $1\times10^{12}$ atoms/cm$^2$ to about $3\times10^{12}$ atoms/cm$^2$.

The gate trench may be formed to expose the third impurity region through the first impurity region and the second impurity region. After forming the gate trench, a hydrogen annealing process may be performed on the semiconductor substrate. The hydrogen annealing process may be performed in a vacuum chamber with a temperature of about 700° C. to about 850° C. and including hydrogen (H$_2$) gas.

The differential gate dielectric layer having the second thickness may be self-aligned between the first impurity region and the gate electrode. A fifth impurity region may be formed by implanting the second conductivity type impurities into the source/drain regions. The concentration of the second conductivity type impurities in the fifth impurity region may be higher than that in the second impurity region, and the differential gate dielectric layer having the second thickness may be self-aligned with the fifth impurity region. The fifth impurity region may be formed by implanting Arsenic (As) at a fifth ion implantation energy of about 5 KeV to about 20 KeV and a fifth dose of about $1\times10^{13}$ atoms/cm$^2$ to about $5\times10^{15}$ atoms/cm$^2$ using an inclined ion implantation process.

Forming the source/drain regions may include implanting Phosphorus (P) into the semiconductor substrate to form the second impurity region; forming the gate trench passing through the second impurity region; and implanting Arsenic (As) into the semiconductor substrate using an inclined ion implantation process to form the fifth impurity region. In one example embodiment, the first impurity region may be omitted. The fifth impurity region may be formed along the surfaces of the source/drain regions. The second impurity region may remain under the fifth impurity region. The concentration of the second conductivity type impurities in the fifth impurity region may be higher than that in the second impurity region. The differential gate dielectric layer having the second thickness may be self-aligned with the fifth impurity region.

The first conductivity type may be an N- or P-type. When the first conductivity type is the N type, the second conductivity type may be the P type, and when the first conductivity type is the P type, the second conductivity type may be the N type. An isolation layer may be formed in the semiconductor substrate. A lower end of the isolation layer may be on a lower level than the gate trench.

According to another example embodiment, a semiconductor device includes a semiconductor substrate having impurities of a first conductivity type. A gate trench is in the semiconductor substrate. Source/drain regions having impurities of a second conductivity type different from the first conductivity type are on both sides of the gate trench in the semiconductor substrate. A gate electrode filling the gate trench is provided. A differential gate dielectric layer interposed between the gate electrode and the semiconductor substrate is provided. The concentration of the second conductivity type impurities increases as the impurities approach the surfaces of the source/drain regions. The differential gate dielectric layer has a first thickness between the gate electrode and the semiconductor substrate and has a second thickness greater than the first thickness between the gate electrode and the source/drain regions.

The source/drain regions may have a first impurity region and a second impurity region. The second impurity region may be under the first impurity region. The first impurity region may have Arsenic (As), and the second impurity region may have Phosphorus (P). The differential gate dielectric layer having the second thickness may be self-aligned with the first impurity region.

A third impurity region including the first conductivity type impurities having a higher concentration than the semiconductor substrate may be provided under the second impurity region. A fourth impurity region including the first conductivity type impurities having a higher concentration than the semiconductor substrate may be provided under the third impurity region. The gate electrode may be provided at a higher level than the fourth impurity region. A fifth impurity region on the first impurity region, and including Arsenic (As) having a higher concentration than the first impurity region, may be provided. In one example embodiment, the differential gate dielectric layer having the second thickness may be self-aligned with the fifth impurity region.

The source/drain regions may include a second impurity region having Phosphorus (P), and a fifth impurity region having Arsenic (As). The fifth region may be on the second impurity region. The concentration of the second conductivity type impurities in the fifth impurity region may be higher than that in the second impurity region. In one example embodiment, the differential gate dielectric layer having the second thickness may be self-aligned with the fifth impurity region.

BRIEF DESCRIPTION OF THE DRAWINGS

Example embodiments will be more clearly understood from the following detailed description taken in conjunction with the accompanying drawings.

FIGS. 1 to 10 are cross-sectional views illustrating a method of fabricating a semiconductor device having a differential gate dielectric layer; and FIGS. 11 to 16 illustrate example embodiments of an application of the semiconductor device.

Figure 1:
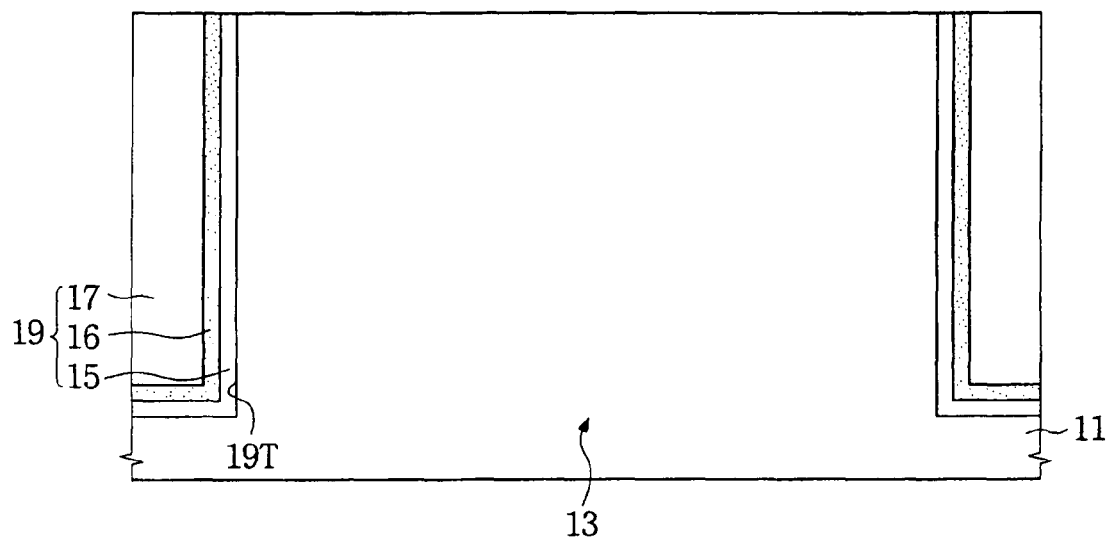
FIGS. 1-16 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms, and should not be construed as being limited to the embodiments set forth herein; rather, these embodiments are provided so that this disclosure will be thorough and complete, and will fully convey the concept of example embodiments to those skilled in the art. In the drawings, the thicknesses of layers and regions are exaggerated for clarity. Like reference numerals denote like elements throughout the specification.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Referring to FIG. 1, an isolation layer 19 defining an active region 13 may be formed in a semiconductor substrate 11. An upper surface of the active region 13 may be exposed. The semiconductor substrate 11 may be a silicon wafer having impurities of a first conductivity type. The first conductivity type may be an N- or P-type. For example, the N type impurities may include arsenic (As), phosphorus (P) and/or a combination thereof, and the P type impurities may include Boron (B). In one example embodiment, the first conductivity type may be the P type. For example, the semiconductor substrate 11 may contain Boron (B). In example embodiments, the active region 13 may contain Boron (B) as well.

The isolation layer 19 may be formed using a shallow trench isolation (STI) technique. For example, the semiconductor substrate 11 may be patterned to form an isolation trench 19T defining the active region 13. The isolation layer 19 filling the isolation trench 19T may be formed. The isolation layer 19 may be formed by sequentially stacking a sidewall oxide layer 15, a nitride layer liner 16 and a gap fill insulating layer 17. The gap fill insulating layer 17 may be formed to completely fill the isolation trench 19T with a silicon oxide layer, e.g., a high-density plasma (HDP) oxide layer and/or a spin on glass (SOG) layer. The nitride layer liner 16 may be formed of a silicon nitride layer, a silicon oxynitride layer or a combination thereof to be disposed between the gap fill insulating layer 17 and the semiconductor substrate 11. The sidewall oxide layer 15 may be formed of a silicon oxide layer, e.g., a thermal oxide layer, to be disposed between the nitride layer liner 16 and the semiconductor substrate 11.

Figure 2:
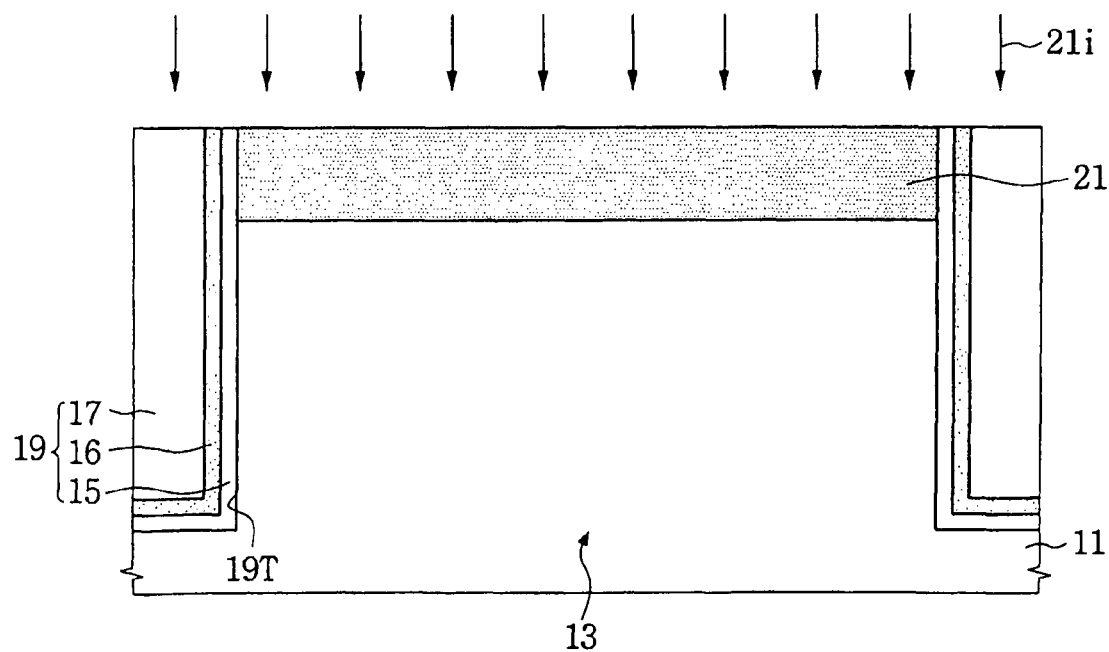

Referring to FIG. 2, impurities of a second conductivity type may be implanted into the active region 13 using a first ion implantation process 21i to form a first impurity region 21. However, the first ion implantation process 21i may be omitted. The second conductivity type may be different from the first conductivity type. For example, when the first conductivity type is the P type, the second conductivity type may be the N type. Also, when the first conductivity type is the N type, the second conductivity type may be the P type. In one example embodiment, the second conductivity type may be the N type. As described above, the N type impurities may include Arsenic (As), Phosphorus (P) and/or a combination thereof, and the P type impurities may include Boron (B).

The first ion implantation process 21i may include implanting impurities of a second conductivity type, for example, N type, from the surface of the active region 13 to a first depth at a first ion implantation energy and first dose. In an example embodiment, the N type impurities may include Arsenic (As). The first ion implantation energy may be about 5 KeV to about 20 KeV, and the first dose may be about $1 \times 10^{13}$ atoms/cm$^2$ to about $5 \times 10^{15}$ atoms/cm$^2$. The first impurity region 21 may be disposed at a higher level than a lower end of the isolation layer 19.

Figure 3:
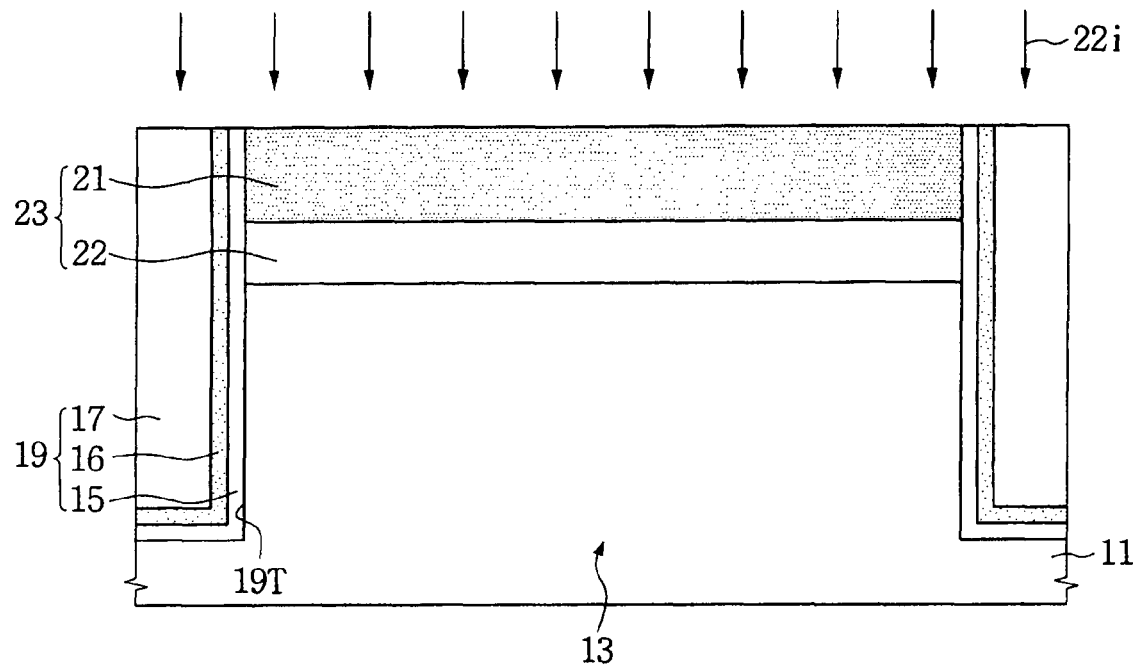

Referring to FIG. 3, impurities of a second conductivity type may be implanted into the active region 13 using a second ion implantation process 22i to form a second impurity region 22. The second ion implantation process 22i may include implanting impurities of a second conductivity type, for example, N type, into the active region 13 up to a second depth at a second ion implantation energy and second dose. In an example embodiment, the N type impurities may include Phosphorous (P). The second ion implantation energy may be higher than the first ion implantation energy, and the second dose may be smaller than the first dose. The second ion implantation energy may be about 10 KeV to about 20 KeV, and the second dose may be about $1 \times 10^{13}$ atoms/cm$^2$ to about $5 \times 10^{13}$ atoms/cm$^2$.

The second depth may be greater than the first depth. The second impurity region 22 may be formed under the first impurity region 21. The second impurity region 22 may be disposed at a higher level than the lower end of the isolation layer 19. The first impurity region 21 and the second impurity region 22 may constitute a preliminary source/drain region 23. The concentration of the second conductivity type impurities may increase as the impurities approach the surface of the preliminary source/drain region 23.

Figure 4:
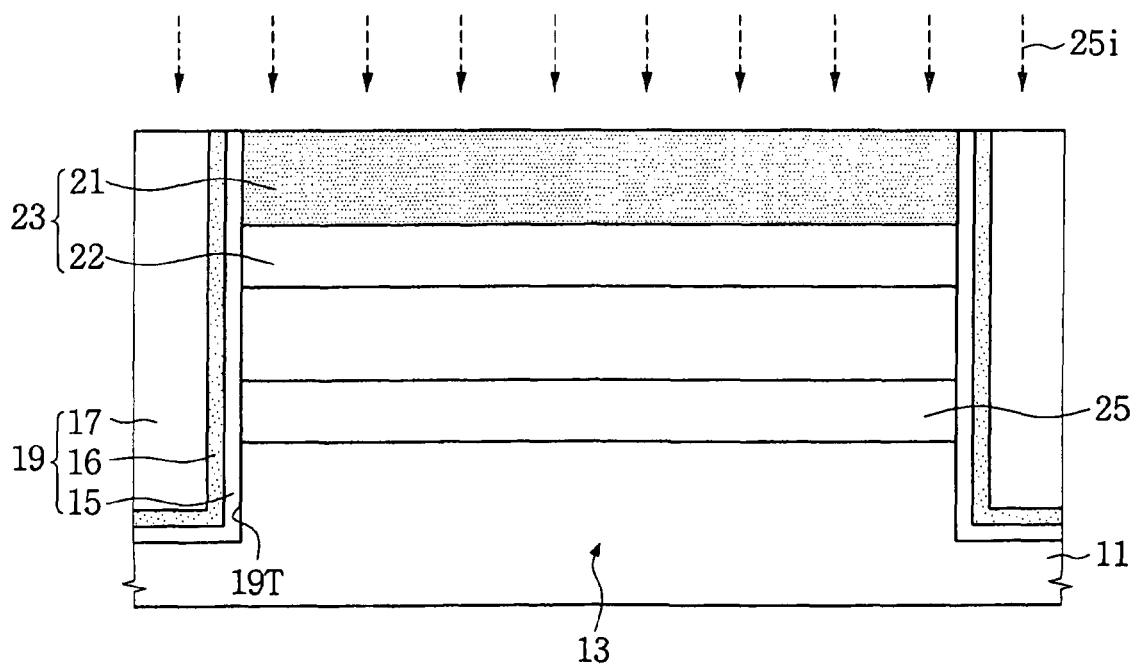

Referring to FIG. 4, a third impurity region 25 may be formed by implanting the first conductivity type impurities into the active region 13 using a third ion implantation process 25i. The third ion implantation process 25i may include implanting impurities of a first conductivity type, for example, P type, into the active region 13 up to a third depth at a third ion implantation energy and third dose. In an example embodiment, the P type impurities may include Boron (B). The third ion implantation energy may be about 30 KeV to about 40 KeV, and the third dose may be about $1 \times 10^{12}$ atoms/cm$^2$ to about $4 \times 10^{12}$ atoms/cm$^2$. The third impurity region 25 may have the first conductivity type impurities having a higher concentration than the active region 13. The third depth may be greater than the second depth.

For example, the third impurity region 25 may be formed under the preliminary source/drain region 23. The third impurity region 25 may be disposed at a higher level than the lower end of the isolation layer 19. As illustrated, a portion of the active region 13 may remain between the third impurity region 25 and the preliminary source/drain region 23. Alternatively, the third impurity region 25 may be formed to be in contact with the preliminary source/drain region 23.

Figure 5:
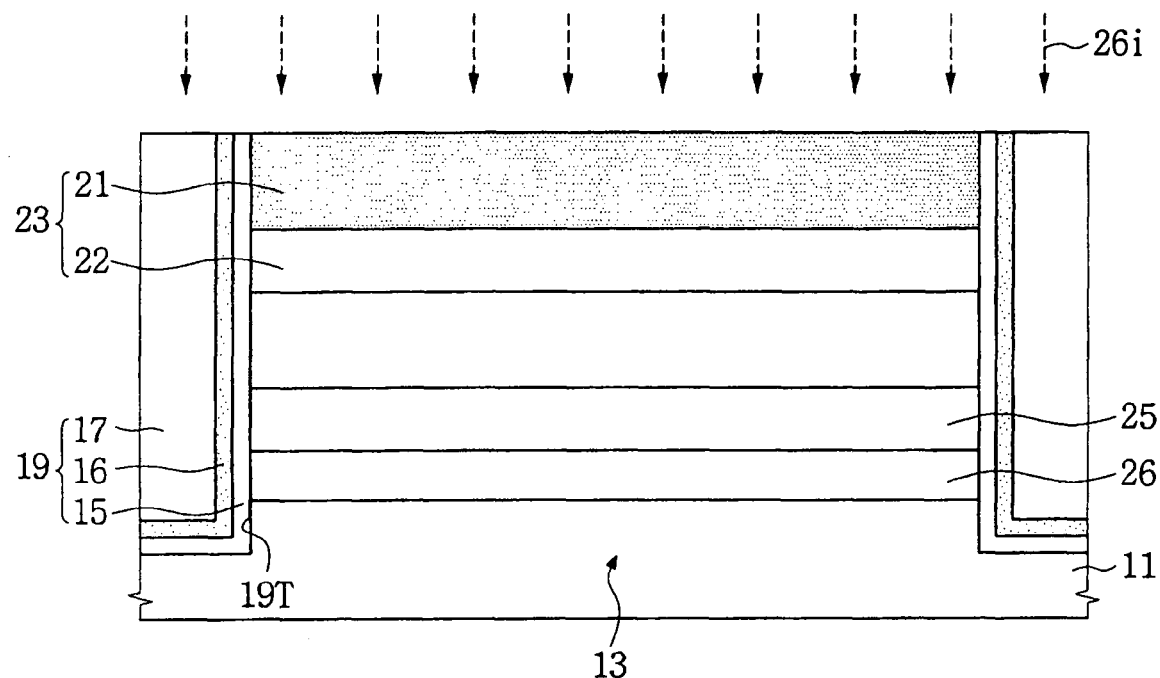

Referring to FIG. 5, a fourth impurity region 26 may be formed by implanting the first conductivity type impurities into the active region 13 using a fourth ion implantation process 26i. The fourth ion implantation process 26i may include implanting impurities of a first conductivity type, for example, P type, into the active region 13 up to a fourth depth at a fourth ion implantation energy and fourth dose. In an example embodiment, the P type impurities may include Boron (B). The fourth ion implantation energy may be about 40 KeV to about 60 KeV, and the fourth dose may be about $1\times10^{12}$ atoms/cm$^2$ to about $3\times10^{12}$ atoms/cm$^2$. The fourth depth may be greater than the third depth. The fourth impurity region 26 may have the first conductivity type impurities having a higher concentration than the active region 13. The fourth impurity region 26 may be formed under the third impurity region 25. The fourth impurity region 26 may be formed at a higher level than the lower end of the isolation layer 19.

Figure 6:
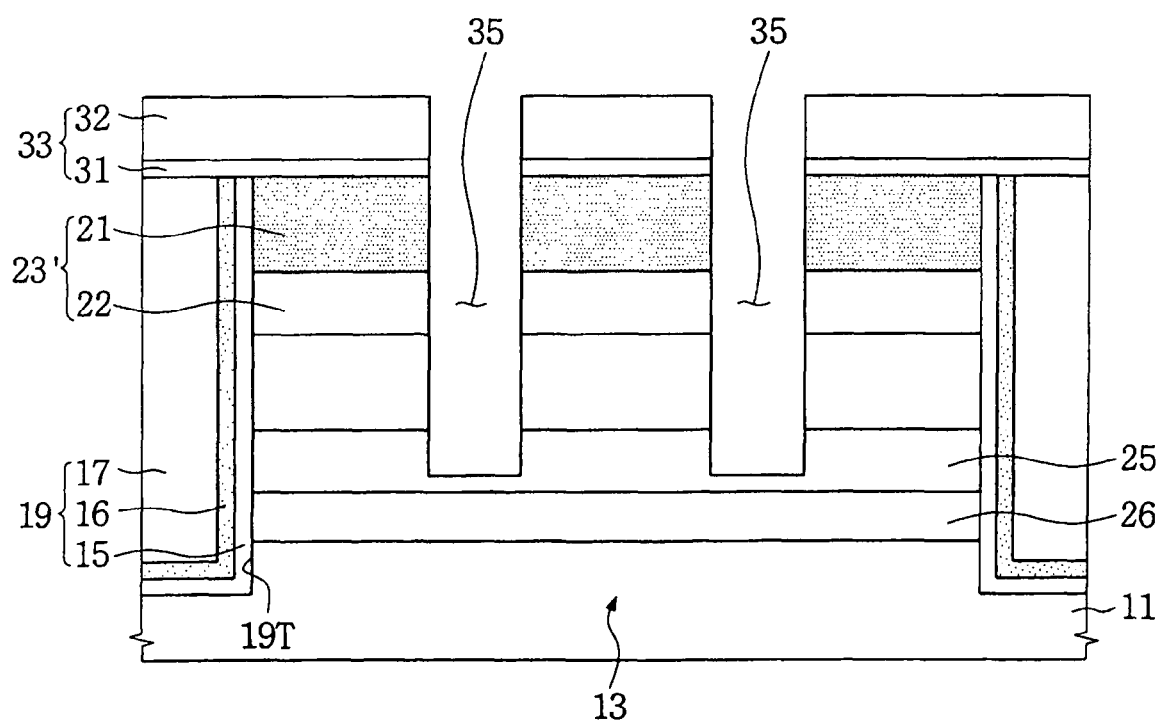

Referring to FIG. 6, a mask pattern 33 may be formed on the semiconductor substrate 11. The mask pattern 33 may be formed by sequentially stacking a pad oxide layer 31 and a hard mask layer 32, and patterning the pad oxide layer 31 and the hard mask layer 32. The pad oxide layer 31 may be formed of a silicon oxide layer. The hard mask layer 32 may be formed of a silicon nitride layer, a silicon oxynitride layer, a silicon oxide layer or a combination thereof.

A gate trench 35 passing through the preliminary source/drain region 23 may be formed using the mask pattern 33 as an etch mask. As a result, the preliminary source/drain region 23 may be divided into a pair of source/drain regions 23' by the gate trench 35. Each of the source/drain regions 23' may have the first impurity region 21 and the second impurity region 22.

Forming the gate trench 35 may include anisotropically etching the semiconductor substrate 11. The gate trench 35 may pass through the preliminary source/drain region 23 and may be formed at a higher level than the fourth impurity region 26. In one example embodiment, the third impurity region 25 may be exposed on the bottom of the gate trench 35, and the first impurity region 21 and the second impurity region 22 may be exposed on a sidewall of the gate trench 35. Further, the active region 13 may be exposed between the second impurity region 22 and the third impurity region 25. Subsequently, the mask pattern 33 may be removed to expose upper surfaces of the source/drain regions 23'.

Figure 7:
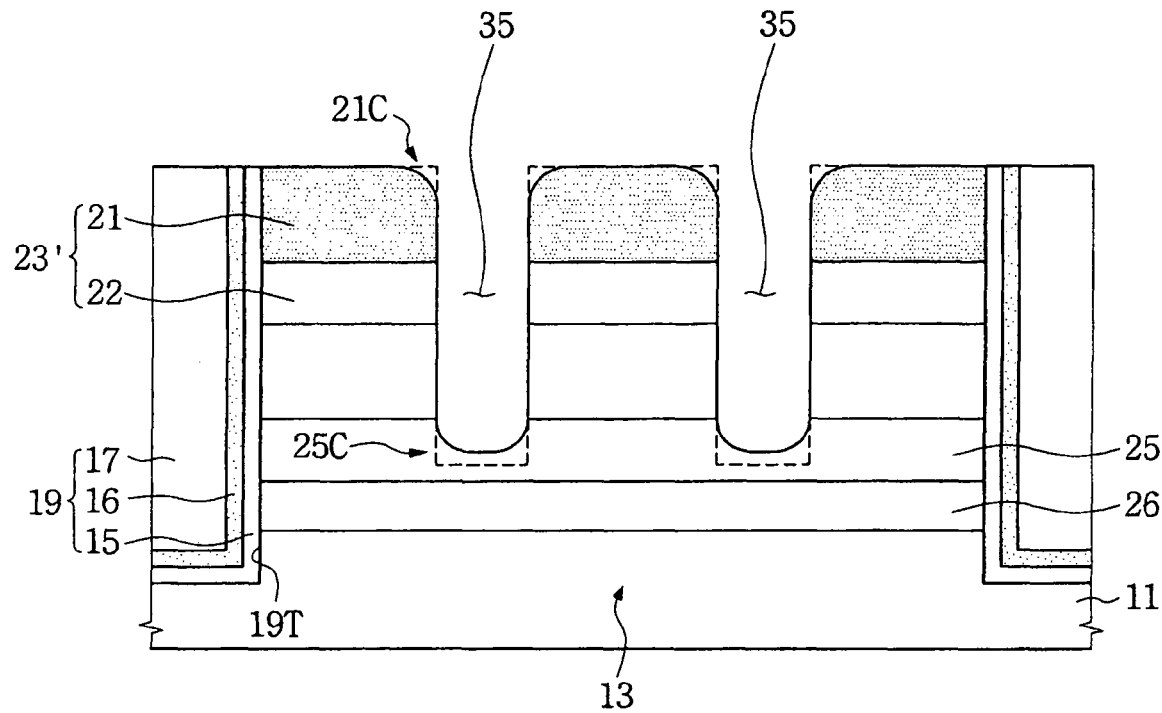

Referring to FIG. 7, a hydrogen annealing process may be performed to round corners 21C of the first impurity region 21 and corners 25C of the third impurity region 25. The hydrogen annealing process may be performed in a vacuum chamber with a temperature of about 700° C. to about 850° C., to which hydrogen (H$_2$) gas is introduced, for about 60 seconds to about 150 seconds.

Figure 8:
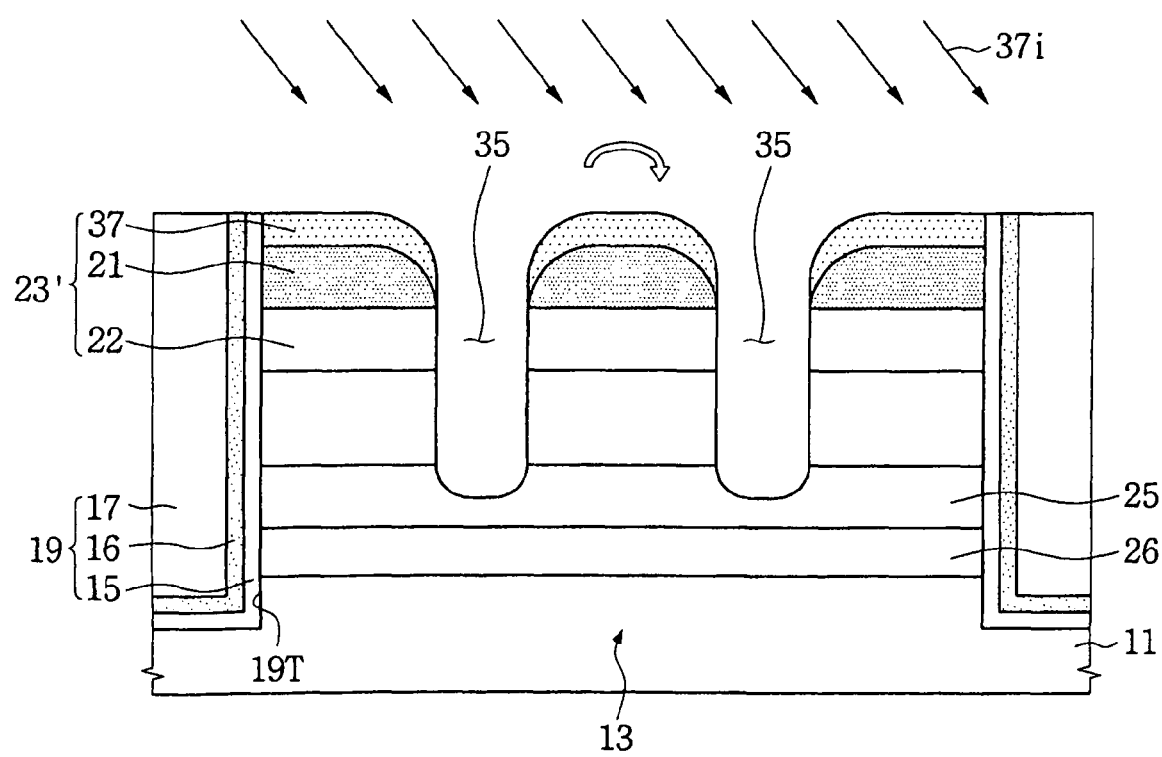

Referring to FIG. 8, the second conductivity type impurities may be implanted into the source/drain regions 23' using a fifth ion implantation process 37$i$ to form a fifth impurity region 37. However, one of the first ion implantation process 21$i$ and the fifth ion implantation process 37$i$ may be omitted.

The fifth ion implantation process 37$i$ may include implanting Arsenic (As) from the surface of the source/drain regions 23' to a fifth depth at a fifth ion implantation energy and fifth dose. The fifth ion implantation energy may be lower than the second ion implantation energy, and the fifth dose may be greater than the second dose. For example, the concentration of the second conductivity type impurities may increase as the impurities approach the upper surfaces of the first impurity region 21. The fifth ion implantation energy may be about 5 KeV to about 20 KeV, and the fifth dose may be about $1\times10^{13}$ atoms/cm$^2$ to about $5\times10^{15}$ atoms/cm$^2$.

The fifth ion implantation process 37$i$ may be performed by an inclined ion implantation process. For example, the fifth ion implantation process 37$i$ may include rotating the semiconductor substrate 11 and implanting the second conductivity type impurities in a diagonal direction making an inclined angle of about 1 to about 89 degrees with respect to the upper surfaces of the source/drain regions 23'. Accordingly, the fifth impurity region 37 may be self-aligned along the upper surfaces of the source/drain regions 23'. For example, the fifth depth may be smaller than the first depth. In one example embodiment, the fifth impurity region 37 may be formed along the surface of the first impurity region 21. For example, the first impurity region 21 may remain under the fifth impurity region 37.

Alternatively, the fifth depth may be greater than the first depth. In one example embodiment, the second impurity region 22 may remain under the fifth impurity region 37. Also, the second conductivity type impurities may be prevented or reduced from being implanted into the third impurity region 25 and the fourth impurity region 26. As described above, each of the source/drain regions 23' may have the first impurity region 21, the second impurity region 22, and the fifth impurity region 37. However, one of the first impurity region 21 and the fifth impurity region 37 may be omitted. The concentration of the second conductivity type impurities may increase as the impurities are getting closer to the upper surfaces of the source/drain regions 23'.

Figure 9:
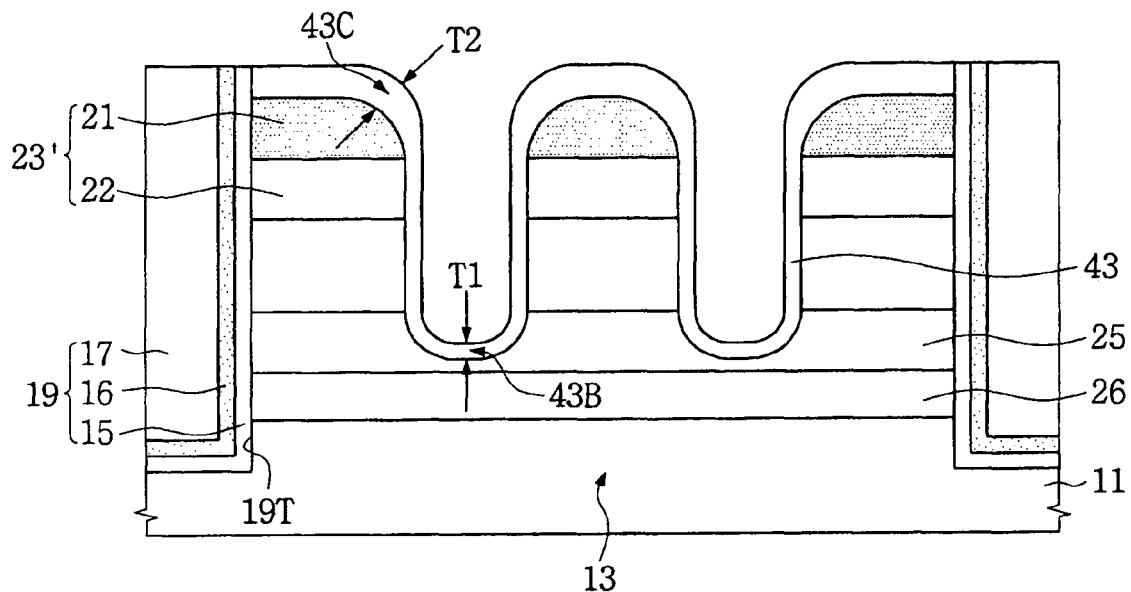

Referring to FIG. 9, a differential gate dielectric layer 43 may be formed along the surfaces of the source/drain regions 23' and the semiconductor substrate 11 exposed through the gate trench 35. The differential gate dielectric layer 43 may be formed of a silicon oxide layer, e.g., a thermal oxide layer. As illustrated in FIG. 9, the differential gate dielectric layer 43 having different thicknesses may be formed on the third impurity region 25, the active region 13, the second impurity region 22, the first impurity region 21 and the fifth impurity region 37 that are exposed through the gate trench 35.

On the third impurity region 25, the active region 13, and the second impurity region 22, the differential gate dielectric layer 43B having a first thickness T1 may be formed, and on the first impurity region 21 and the fifth impurity region 37, the differential gate dielectric layer 43C having a second thickness T2 may be formed. The second thickness T2 may be greater than the first thickness T1. For example, as the concentration of the second conductivity type impurities is higher, the differential gate dielectric layer 43 may be formed thicker. Accordingly, the differential gate dielectric layer 43C having the second thickness T2 may be self-aligned with the first impurity region 21 or the fifth impurity region (37 of FIG. 8).

Consequently, the differential gate dielectric layer 43B having the first thickness T1 may be formed in a lower end region of the gate trench 35, and the differential gate dielectric layer 43C having the second thickness T2 greater than the first thickness T1 may be formed at the corners of the source/drain regions 23'. Alternatively, the differential gate dielectric layer 43 may be formed of a silicon oxide layer, a silicon oxynitride layer, a silicon nitride layer, high-K dielectrics or a combination thereof by a chemical vapor deposition (CVD) method or an atomic layer deposition (ALD) method.

Figure 10:
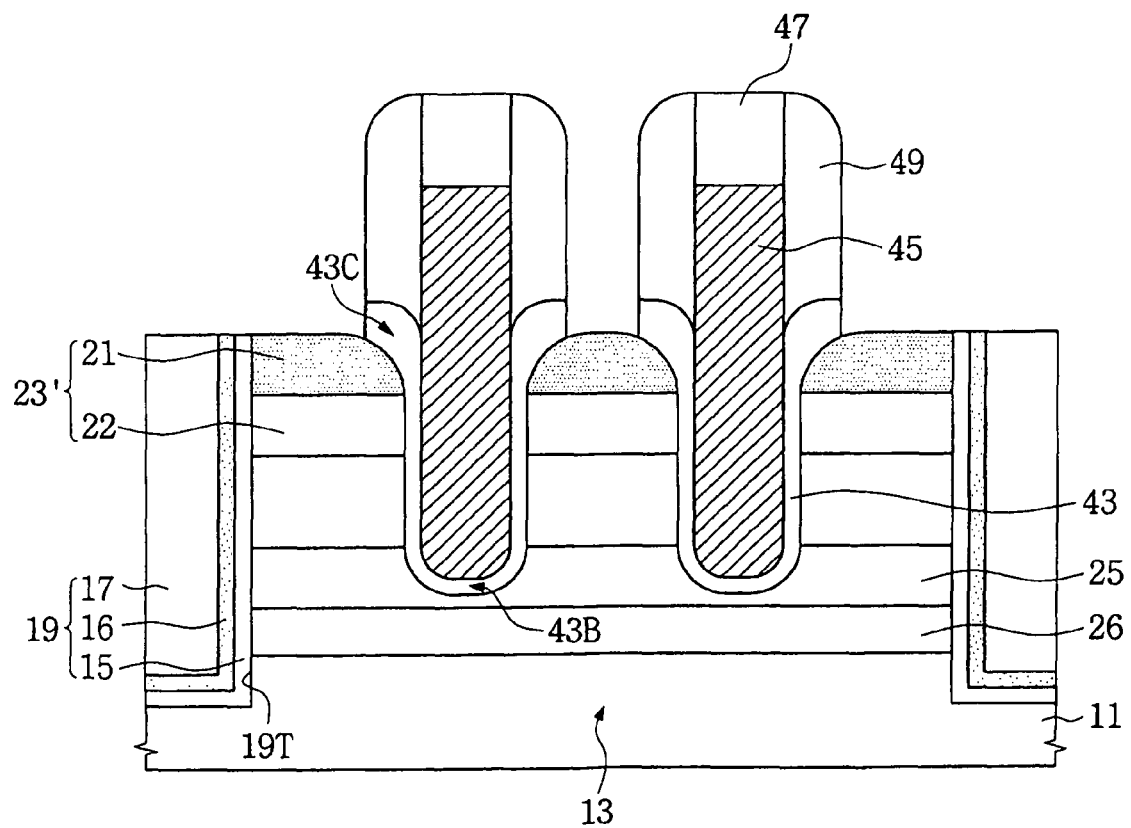

Referring to FIG. 10, a gate electrode 45 filling the gate trench 35 may be formed on the differential gate dielectric layer 43. A gate mask pattern 47 may remain on the gate electrode 45. The gate electrode 45 may project higher than the source/drain regions 23'. An insulating spacer 49 may be formed on sidewalls of the gate mask pattern 47 and the gate electrode 45. The differential gate dielectric layer 43 may remain under the insulating spacer 49.

The gate electrode 45 may be formed of a conductive layer, e.g., a polysilicon layer, a metal layer, a metal silicide layer or a combination thereof. The gate mask pattern 47 may be formed of a silicon oxide layer, a silicon oxynitride layer, a silicon nitride layer or a combination thereof. The insulating spacer 49 may be formed of a silicon oxide layer, a silicon oxynitride layer, a silicon nitride layer or a combination thereof.

As illustrated in FIG. 10, the gate electrode 45 may overlap the source/drain regions 23'. The differential gate dielectric layer 43 may be interposed between the gate electrode 45 and the source/drain regions 23'. The differential gate dielectric layer 43 may include the differential gate dielectric layer 43B having the first thickness T1 and the differential gate dielectric layer 43C having the second thickness T2. The differential gate dielectric layer 43C having the second thickness T2 may be self-aligned with the first impurity region 21 or the fifth impurity region (37 of FIG. 8). As described above, the differential gate dielectric layer 43C having the second thickness T2 may be thicker than the differential gate dielectric layer 43B having the first thickness T1. Also, the differential gate dielectric layer 43C having the second thickness T2 may be formed to be much thicker compared to the conventional art. A gate induced drain leakage (GIDL) current may tend to decrease as the second thickness T2 of the differential gate dielectric layer 43C increases. According to an example embodiment, the GIDL current may be reduced compared to the conventional art.

A semiconductor device according to an example embodiment will be described with reference again to FIGS. 8 to 10. Referring again to FIGS. 8 to 10, a semiconductor substrate 11 having impurities of a first conductivity type may be provided. A gate trench 19T may be disposed in the semiconductor substrate 11. Source/drain regions 23' having impurities of a second conductivity type different from the first conductivity type may be disposed in the semiconductor substrate 11 on both sides of the gate trench 19T. A gate electrode 45 filling the gate trench 35 may be provided. A differential gate dielectric layer 43 interposed between the gate electrode 45 and the semiconductor substrate 11 may be provided. The concentration of the second conductivity type impurities may increase as the impurities approach the surfaces of the source/drain region 23'. The differential gate dielectric layer 43 may have a first thickness (T1 of FIG. 9) between the gate electrode 45 and the semiconductor substrate 11, and may have a second thickness (T2 of FIG. 9) greater than the first thickness (T1 of FIG. 9) between the gate electrode 45 and the source/drain regions 23'.

The source/drain regions 23' may have a first impurity region 21 and a second impurity region 22. The second impurity region 22 may be disposed under the first impurity region 21. The first impurity region 21 may contain Arsenic (As), and the second impurity region 22 may contain Phosphorus (P). The differential gate dielectric layer 43C having the second thickness T2 may be self-aligned with the first impurity region 21. A third impurity region 25 including the first conductivity type impurities having a higher concentration than the semiconductor substrate 11 may be provided under the second impurity region 22. A fourth impurity region 26 that includes the first conductivity type impurities having a higher concentration than the semiconductor substrate 11 may be provided under the third impurity region 25. The gate electrode 45 may be provided at a higher level than the fourth impurity region 26.

A fifth impurity region (37 of FIG. 8) disposed on the first impurity region 21 and including Arsenic (As) having a higher concentration than the first impurity region 21 may be provided. In one example embodiment, the differential gate dielectric layer 43C having the second thickness (T2 of FIG. 9) may be self-aligned with the fifth impurity region (37 of FIG. 8).

The source/drain regions 23' may include the second impurity region 22 having Phosphorous (P) and the fifth impurity region (37 of FIG. 8) having Arsenic (As). For example, the first impurity region 21 may be omitted. The fifth impurity region (37 of FIG. 8) may be disposed on the second impurity region 22. The concentration of the second conductivity type impurities in the fifth impurity region (37 of FIG. 8) may be higher than that in the second impurity region 22. In one example embodiment, the differential gate dielectric layer 43C having the second thickness (T2 of FIG. 9) may be self-aligned with the fifth impurity region (37 of FIG. 8).

An isolation layer 19 defining an active region 13 may be provided in the semiconductor substrate 11. A lower end of the isolation layer 19 may be disposed at a lower level than the gate electrode 45. The isolation layer 19 may include a sidewall oxide layer 15, a nitride layer liner 16, and a gap fill insulating layer 17, which are sequentially stacked. A gate mask pattern 47 may remain on the gate electrode 45. The gate electrode 45 may project higher than the source/drain regions 23'. An insulating spacer 49 may be disposed on sidewalls of the gate mask pattern 47 and the gate electrode 45. The differential gate dielectric layer 43 may remain under the insulating spacer 49.

According to example embodiments, a relatively thick differential gate dielectric layer between a gate electrode and source/drain regions may be formed. Accordingly, a semiconductor device with improved electrical characteristics, e.g., a gate induced drain leakage (GIDL) current, may be implemented.

Implementation Embodiments

Figure 11:
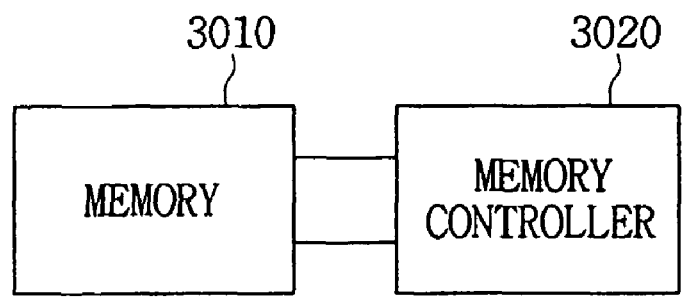

FIG. 11 illustrates an example embodiment of an application of the semiconductor device. As shown, this embodiment includes a memory 3010 connected to a memory controller 3020. The memory 3010 may be any of the semiconductor device embodiments described above. The memory controller 3020 supplies the input signals for controlling operation of the memory 3010. For example, the memory controller 3020 supplies the command CMD and address signals.

Figure 12:
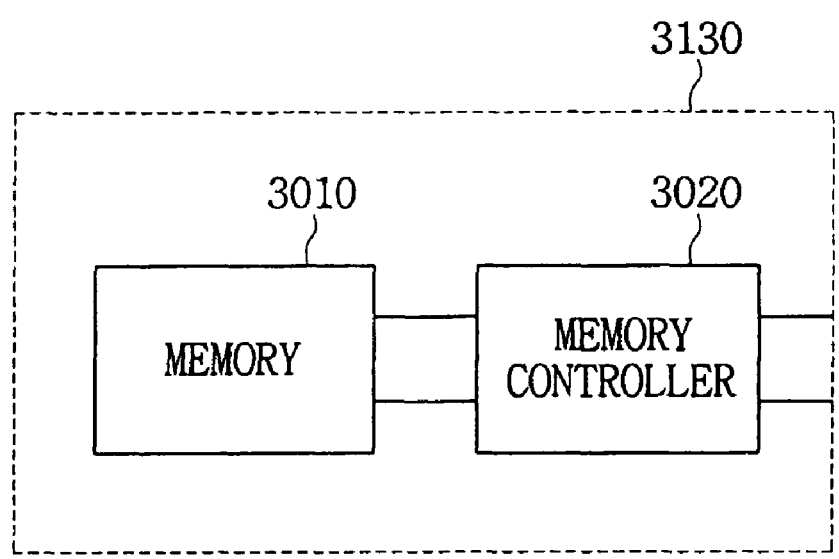

FIG. 12 illustrates yet another embodiment. This embodiment is the same as the embodiment of FIG. 11, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 13:
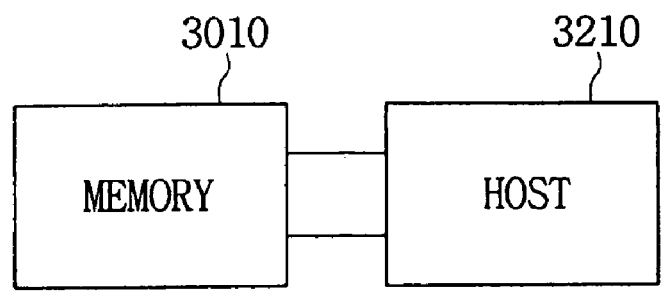

FIG. 13 illustrates a still further embodiment of the present invention. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 supplies the command CMD and address signals.

Figure 14:
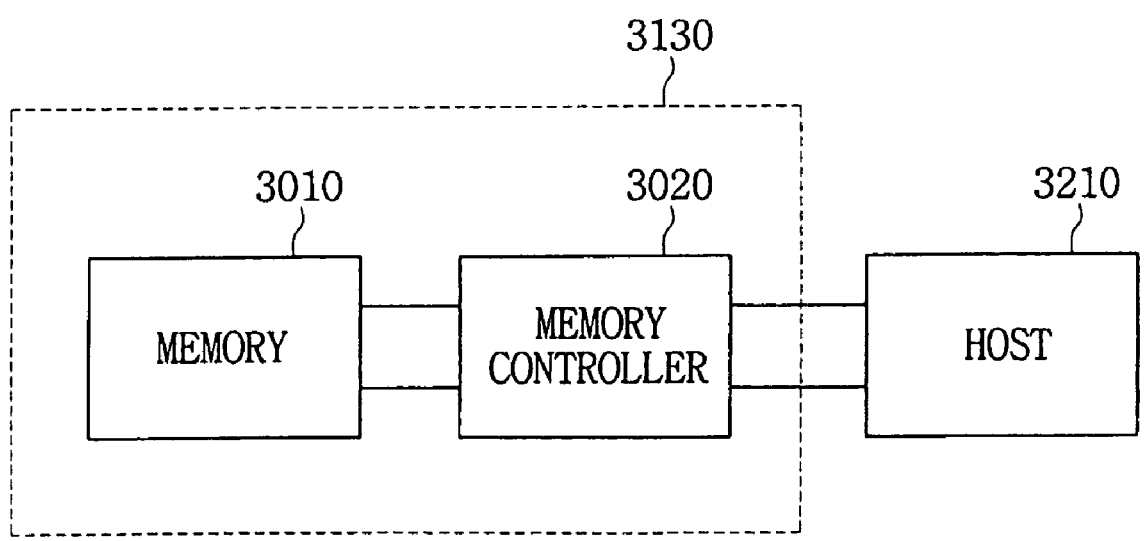

FIG. 14 illustrates an embodiment of the present invention in which the host system 3210 is connected to the card 3130 of FIG. 12. In this embodiment, the host system 3210 applies control signals to the card 3130 such that the memory controller 3020 controls operation of the memory 3010.

Figure 15:
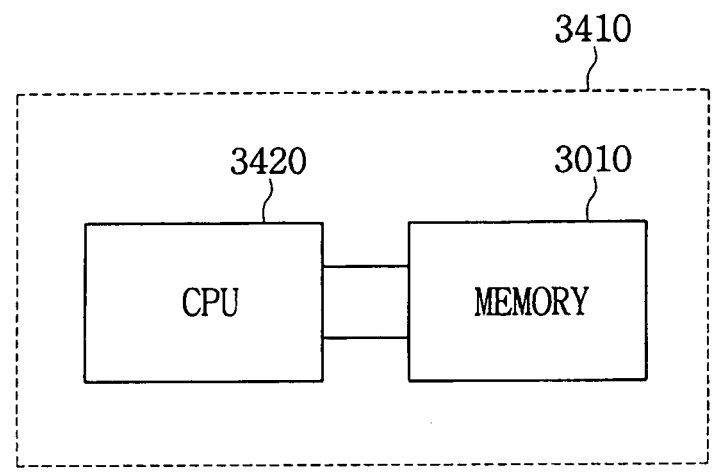

FIG. 15 illustrates a further embodiment of the present invention. As shown, the memory 3010 may be connected to a central processing unit (CPU) 3420 within a computer system 3410. For example, the computer system 3410 may be a personal computer, personal data assistant, etc. The memory 3010 may be directly connected with the CPU 3420, connected via a bus, etc. It will be appreciated, that FIG. 15 does not illustrate the full complement of components that may be included within a computer system 3410 for the sake of clarity.

Figure 16:
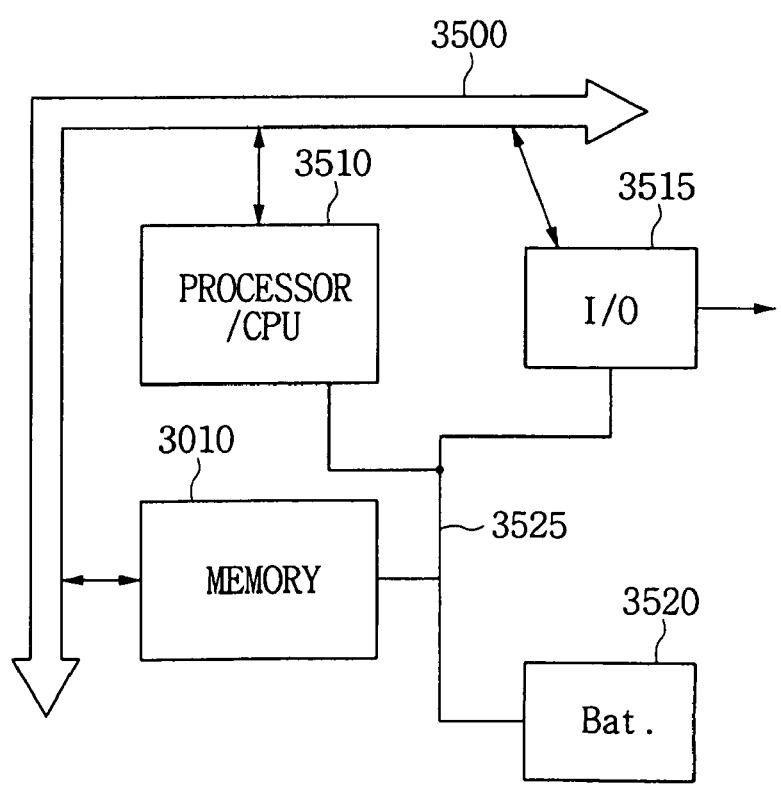

FIG. 16 illustrates another embodiment of the present invention. FIG. 16 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 16, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 16. Furthermore, the present invention is not limited to this architecture. For example, the memory 3010 may be replaced with the embodiment of FIG. 12, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of fabricating a semiconductor device, comprising:
   forming a gate trench in a semiconductor substrate to define source/drain regions separated from each other by the gate trench, wherein the semiconductor substrate is exposed through the gate trench and includes impurities of a first conductivity type, the source/drain regions include impurities of a second conductivity type different from the first conductivity type, and the concentration of the second conductivity type impurities increases as the impurities approach the surfaces of the source/drain regions;
   forming a differential gate dielectric layer along the surfaces of the source/drain regions and the semiconductor substrate exposed through the gate trench; and
   forming a gate electrode filling the gate trench,
   wherein the differential gate dielectric layer has a first thickness between the gate electrode and the semiconductor substrate and has a second thickness greater than the first thickness between the gate electrode and the source/drain regions, and
   wherein forming the gate trench to define source/drain regions includes,
      implanting Arsenic (As) into the semiconductor substrate to form a first impurity region,
      implanting Phosphorous (P) into the semiconductor substrate to form a second impurity region under the first impurity region,
      implanting the first conductivity type impurities into a lower part of the second impurity region to form a third impurity region, and
      implanting the first conductivity type impurities into a lower part of the third impurity region to form a fourth impurity region.

2. The method of claim 1, wherein forming the first impurity region includes a first ion implantation energy of about 5 KeV to about 20 KeV, and a first dose of about $1\times10^{13}$ atoms/$cm^2$ to about $5\times10^{15}$ atoms/$cm^2$, and forming the second impurity region includes a second ion implantation energy of about 10 KeV to about 20 KeV, and a second dose of about $1\times10^{13}$ atoms/$cm^2$ to about $5\times10^{13}$ atoms/$cm^2$, and
   wherein the first ion implantation energy is lower than the second ion implantation energy and the first dose is greater than the second dose.

3. The method of claim 1, wherein forming the third impurity region includes implanting Boron (B) at a third ion implantation energy of about 30 KeV to about 40 KeV and a third dose of about $1\times10^{12}$ atoms/$cm^2$ to about $4\times10^{12}$ atoms/$cm^2$, and forming the fourth impurity region includes implanting B at a fourth ion implantation energy of about 40 KeV to about 60 KeV, and a fourth dose of about $1\times10^{12}$ atoms/$cm^2$ to about $3\times10^{12}$ atoms/$cm^2$.

4. The method of claim 1, wherein forming the gate trench includes exposing the third impurity region through the first impurity region and the second impurity region.

5. The method of claim 4, further comprising:
   performing a hydrogen annealing process on the semiconductor substrate to round the corners of the first impurity region and the third impurity region after forming the gate trench,
   wherein the hydrogen annealing process is performed in a vacuum chamber with a temperature of about 700° C. to about 850° C. and includes introducing hydrogen ($H_2$) gas into the vacuum chamber.

6. The method of claim 1, wherein the differential gate dielectric layer having the second thickness is self-aligned between the first impurity region and the gate electrode.

7. The method of claim 1, further comprising:
forming a fifth impurity region by implanting the second conductivity type impurities into the source/drain regions,
wherein the concentration of the second conductivity type impurities in the fifth impurity region is higher than that in the second impurity region, and the differential gate dielectric layer having the second thickness is self-aligned with the fifth impurity region.

8. The method of claim 7, wherein forming the fifth impurity region includes implanting Arsenic (As) at a fifth ion implantation energy of about 5 KeV to about 20 KeV, and a fifth dose of about $1\times10^{13}$ atoms/cm$^2$ to about $5\times10^{15}$ atoms/cm$^2$ using an inclined ion implantation process.

9. The method of claim 1, further comprising:
forming an isolation layer in the semiconductor substrate, wherein a lower end of the isolation layer is on a lower level than the gate trench.

10. A method of fabricating a semiconductor device, comprising:
forming a gate trench in a semiconductor substrate to define source/drain regions separated from each other by the gate trench, wherein the semiconductor substrate is exposed through the gate trench and includes impurities of a first conductivity type, the source/drain regions include impurities of a second conductivity type different from the first conductivity type, and the concentration of the second conductivity type impurities increases as the impurities approach the surfaces of the source/drain regions;
forming a differential gate dielectric layer along the surfaces of the source/drain regions and the semiconductor substrate exposed through the gate trench; and
forming a gate electrode filling the gate trench,
wherein the differential gate dielectric layer has a first thickness between the gate electrode and the semiconductor substrate and has a second thickness greater than the first thickness between the gate electrode and the source/drain regions,
wherein forming the source/drain regions includes,
implanting Phosphorus (P) into the semiconductor substrate to form a second impurity region,
forming the gate trench passing through the second impurity region, and
implanting Arsenic (As) into the semiconductor substrate using an inclined ion implantation process to form a fifth impurity region, and
wherein the fifth impurity region is formed along the surfaces of the source/drain regions, the second impurity region remains under the fifth impurity region, the concentration of the second conductivity type impurities in the fifth impurity region is higher than that in the second impurity region, and the differential gate dielectric layer having the second thickness is self-aligned with the fifth impurity region.

11. The method of claim 10, wherein forming the second impurity region includes a second ion implantation energy of about 10 KeV to about 20 KeV, and a second dose of about $1\times10^{13}$ atoms/cm$^2$ to about $5\times10^{13}$ atoms/cm$^2$, and forming the fifth impurity region includes a fifth ion implantation energy of about 5 KeV to about 20 KeV, and a fifth dose of about $1\times10^{13}$ atoms/cm$^2$ to about $5\times10^{15}$ atoms/cm$^2$, and wherein the fifth ion implantation energy is lower than the second ion implantation energy, and the fifth dose is greater than the second dose.

12. A method of fabricating a semiconductor device, comprising:
forming a gate trench in a semiconductor substrate to define source/drain regions separated from each other by the gate trench;
performing a hydrogen annealing process in a vacuum chamber to round the corners of the semiconductor substrate and source/drain regions;
forming a differential gate dielectric layer along the surfaces of the source/drain regions and the semiconductor substrate exposed through the gate trench; and
forming a gate electrode filling the gate trench,
wherein the differential gate dielectric layer has a first thickness between the gate electrode and the semiconductor substrate and has a second thickness greater than the first thickness between the gate electrode and the source/drain regions, and
wherein forming the gate trench to define source/drain regions includes,
implanting Arsenic (As) into the semiconductor substrate to form a first impurity region,
implanting Phosphorous (P) into the semiconductor substrate to form a second impurity region under the first impurity region,
implanting a first conductivity type impurities into a lower part of the second impurity region to form a third impurity region, and
implanting the first conductivity type impurities into a lower part of the third impurity region to form a fourth impurity region.

13. The method of claim 12, wherein forming the gate trench to define source/drain regions includes implanting the arsenic (As) into the semiconductor substrate using an inclined ion implantation process.

14. A method of fabricating a semiconductor device, comprising:
forming source/drain regions in a semiconductor substrate separated from each other by a gate trench, wherein forming the source/drain regions includes implanting N type impurities into the semiconductor substrate using an inclined ion implantation process;
forming a differential gate dielectric layer along the surfaces of the source/drain regions and the semiconductor substrate exposed through the gate trench; and
forming a gate electrode filling the gate trench,
wherein the differential gate dielectric layer has a first thickness between the gate electrode and the semiconductor substrate and has a second thickness greater than the first thickness between the gate electrode and the source/drain regions, and
wherein forming the source/drain regions includes,
implanting Arsenic (As) into the semiconductor substrate to form a first impurity region,
implanting Phosphorous (P) into the semiconductor substrate to form a second impurity region under the first impurity region,
implanting a first conductivity type impurities into a lower part of the second impurity region to form a third impurity region, and
implanting the first conductivity type impurities into a lower part of the third impurity region to form a fourth impurity region.

15. A method of fabricating a semiconductor device, comprising:

forming a gate trench in a semiconductor substrate to define source/drain regions separated from each other by the gate, wherein the semiconductor substrate is exposed through the gate trench and includes impurities of a first conductivity type, the source/drain regions include impurities of a second conductivity type different from the first conductivity type, and the concentration of the second conductivity type impurities increases as the impurities approach the surfaces of the source/drain regions;

performing a hydrogen annealing process to round the corners of the semiconductor substrate;

forming a differential gate dielectric layer along the surfaces of the source/drain regions and the semiconductor substrate exposed through the gate trench; and forming a gate electrode filling the gate trench, wherein the differential gate dielectric layer has a first thickness between the gate electrode and the semiconductor substrate and has a second thickness greater than the first thickness between the gate electrode and the source/drain regions, and wherein forming the gate trench to define source/drain regions includes, implanting Arsenic (As) into the semiconductor substrate to form a first impurity region, implanting Phosphorous (P) into the semiconductor substrate to form a second impurity region under the first impurity region, implanting the first conductivity type impurities into a lower part of the second impurity region to form a third impurity region, and implanting the first conductivity type impurities into a lower part of the third impurity region to form a fourth impurity region.

\* \* \* \* \*